(12) United States Patent
Deboy et al.

(10) Patent No.: US 12,150,236 B2
(45) Date of Patent: Nov. 19, 2024

(54) VOLTAGE REGULATOR MODULE WITH INDUCTOR-COOLED POWER STAGE

(71) Applicant: Infineon Technologies Austria AG, Villach (AT)

(72) Inventors: Gerald Deboy, Klagenfurt (AT); Kok Yau Chua, Melaka (MY); Angela Kessler, Sinzing (DE); Kennith Kin Leong, Villach (AT); Chee Yang Ng, Muar (MY); Luca Peluso, Villach (AT)

(73) Assignee: Infineon Technologies Austria AG, Villach (AT)

( * ) Notice: Subject to any disclaimer, the term of this patent is extended or adjusted under 35 U.S.C. 154(b) by 376 days.

(21) Appl. No.: 17/742,442

(22) Filed: May 12, 2022

(65) Prior Publication Data

US 2023/0371165 A1  Nov. 16, 2023

(51) Int. Cl.
| | |
|---|---|
| *H05K 1/02* | (2006.01) |
| *H01F 27/24* | (2006.01) |
| *H05K 1/18* | (2006.01) |
| *H05K 7/20* | (2006.01) |

(52) U.S. Cl.
CPC ........... *H05K 1/0203* (2013.01); *H01F 27/24* (2013.01); *H05K 1/0216* (2013.01); *H05K 1/182* (2013.01); *H05K 7/2039* (2013.01); *H05K 2201/1003* (2013.01); *H05K 2201/10166* (2013.01)

(58) Field of Classification Search
CPC .... H01F 27/24; H05K 1/0203; H05K 1/0216; H05K 1/182; H05K 7/2039; H05K 2201/1003; H05K 2201/10166
See application file for complete search history.

(56) References Cited

U.S. PATENT DOCUMENTS

| | | | | |
|---|---|---|---|---|
| 5,867,367 | A | * | 2/1999 | Barrow ............. H01L 23/49568 257/676 |
| 6,160,223 | A | * | 12/2000 | Gates ................... H05K 1/0203 174/252 |
| 2003/0141600 | A1 | | 7/2003 | Van |
| 2007/0075815 | A1 | | 4/2007 | Lotfi et al. |

(Continued)

FOREIGN PATENT DOCUMENTS

| | | |
|---|---|---|
| EP | 1942574 A1 | 7/2008 |
| JP | 2010045111 A | 2/2010 |

*Primary Examiner* — Jue Zhang
*Assistant Examiner* — Lakaisha Jackson
(74) *Attorney, Agent, or Firm* — Murphy, Bilak & Homiller, PLLC

(57) ABSTRACT

A voltage regulator module includes: power input and output terminals at a same side of the voltage regulator module; a first power stage configured to receive an input voltage from the power input terminal and output a phase current at a switch node of the first power stage, the first power stage including an inductor having a vertical conductor embedded in a magnetic core, the vertical conductor having a first end which is electrically connected to the switch node and a second end opposite the first end; and a first metal clip which electrically connects the second end of the vertical conductor to the power output terminal such that power is delivered to and from the voltage regulator module at the same side of the voltage regulator module. A method of producing the voltage regulator module and electronic assembly that includes the voltage regulator module are also described.

23 Claims, 9 Drawing Sheets

(56) References Cited

U.S. PATENT DOCUMENTS

| | | |
|---|---|---|
| 2008/0272483 A1 | 11/2008 | Oman |
| 2010/0085139 A1 | 4/2010 | Yan et al. |
| 2011/0053319 A1* | 3/2011 | Hohlfeld ............... H01L 25/072 |
| | | 257/E21.499 |
| 2017/0148705 A1 | 5/2017 | Cho |
| 2018/0054119 A1 | 2/2018 | Cho et al. |
| 2018/0182532 A1 | 6/2018 | Stahr et al. |
| 2018/0190573 A1 | 7/2018 | Mullenix et al. |
| 2018/0270957 A1 | 9/2018 | Swaminathan et al. |
| 2020/0161274 A1 | 5/2020 | Lee |
| 2020/0245465 A1 | 7/2020 | Zhang et al. |
| 2021/0105898 A1 | 4/2021 | Chiang et al. |
| 2021/0307173 A1 | 9/2021 | Lenhardt et al. |

* cited by examiner

VOLTAGE REGULATOR MODULE WITH INDUCTOR-COOLED POWER STAGE

BACKGROUND

Increasing power demand of modern processors combined with variable and decreasing point-of-load voltages drives load currents to very high levels with current peaks of 1000 A and higher becoming common. In addition, the dynamic requirements on load jumps, specifically the sudden increase of load currents, are very challenging to address. As the capability of modern processors to perform additional computational calculations is mainly thermally limited, a precise regulation of the voltage at the interface to the processor becomes increasingly important. With the power dissipation of processors basically scaling with the square of the input voltage, a lowering of the input voltage closer to the threshold of catastrophic processor failure enables processors to run cooler and take additional computational tasks, making precise voltage regulation even more important.

Thus, there is a need for an improved voltage regulator module for regulating the voltage at the interface to a processor.

SUMMARY

According to an embodiment of a voltage regulator module, the voltage regulator module comprises: a power input terminal; a power output terminal at a same side of the voltage regulator module as the power input terminal; a first power stage configured to receive an input voltage from the power input terminal and output a phase current at a switch node of the first power stage, the first power stage including an inductor having a vertical conductor embedded in a magnetic core, the vertical conductor having a first end which is electrically connected to the switch node and a second end opposite the first end; and a first metal clip which electrically connects the second end of the vertical conductor to the power output terminal such that power is delivered to and from the voltage regulator module at the same side of the voltage regulator module.

According to an embodiment of an electronic assembly, the electronic assembly comprises: a processor substrate; a processor mounted on the processor substrate; and a voltage regulator module mounted on the processor substrate and configured to provide power to the processor, wherein the voltage regulator module comprises: a power input terminal attached to a first side of the processor substrate; a power output terminal attached to the same side of the processor substrate as the power input terminal; a first power stage configured to receive an input voltage from the power input terminal and output a phase current at a switch node of the first power stage, the first power stage including an inductor having a vertical conductor embedded in a magnetic core, the vertical conductor having a first end which faces the processor substrate and is electrically connected to the switch node, and a second end which faces away from the processor substrate; and a first metal clip which electrically connects the second end of the vertical conductor to the power output terminal such that power is delivered to and from the voltage regulator module at the same side of the processor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a voltage regulator module having input and output terminals at the same side of the voltage regulator module. An inductor embedded in a magnetic core has a first end electrically connected to the switch node of a power stage included in the voltage regulator module. A metal clip electrically connects the opposite end of the inductor to the power output terminal of the voltage regulator module such that power is delivered to and from the voltage regulator module at the same side of the voltage regulator module. The inductor provides effective cooling and a low-ohmic current path with minimum parasitic inductance. The output current exits the power stage at a second interface of the voltage regulator module and is routed back to the first interface with the input and output terminals by a low-ohmic path. More than one power stage may be included in the voltage regulator module to form a multi-phase arrangement for regulating the output voltage of a load.

Described next, with reference to the figures, are exemplary embodiments of the voltage regulator module, a method of producing the voltage regulator module, and an electronic assembly that includes the voltage regulator module.

Figure 1:
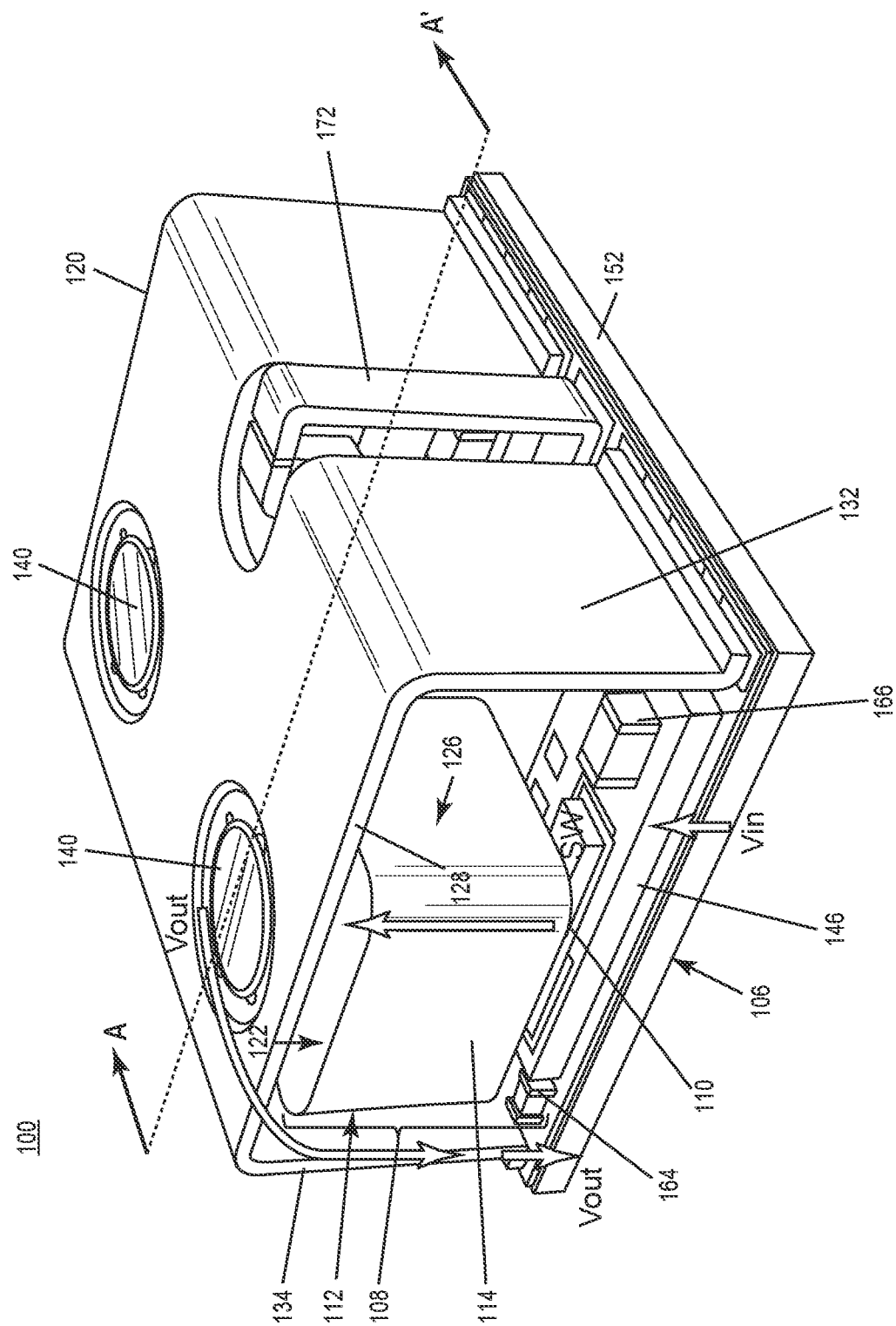
FIG. 1 illustrates a side perspective view of an embodiment of a voltage regulator module.
Figure 2:
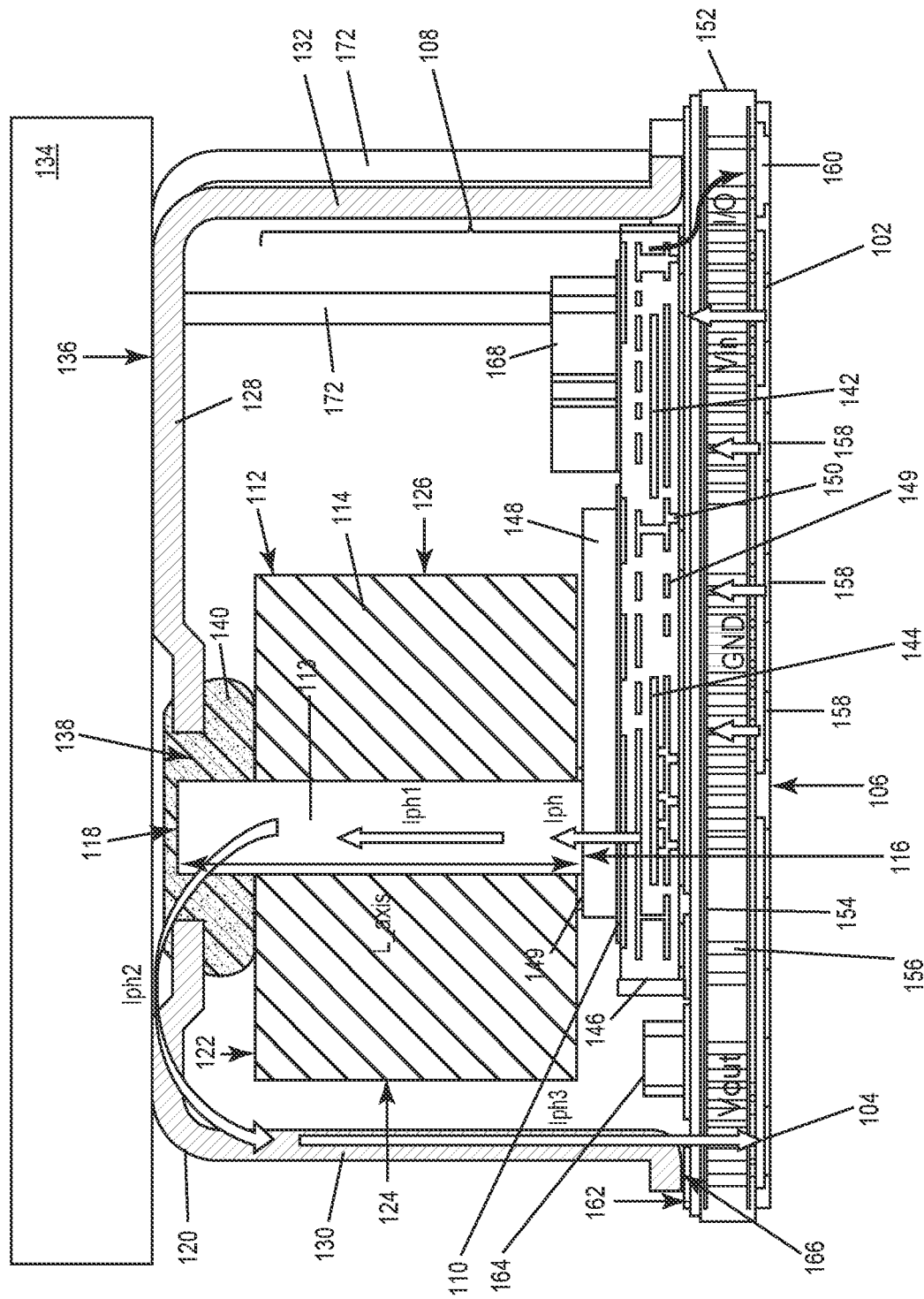
FIG. 2 illustrates a cross-sectional view of the voltage regulator module along the line labelled A-A' in FIG. 1, with a current flow superposition.
Figure 3:
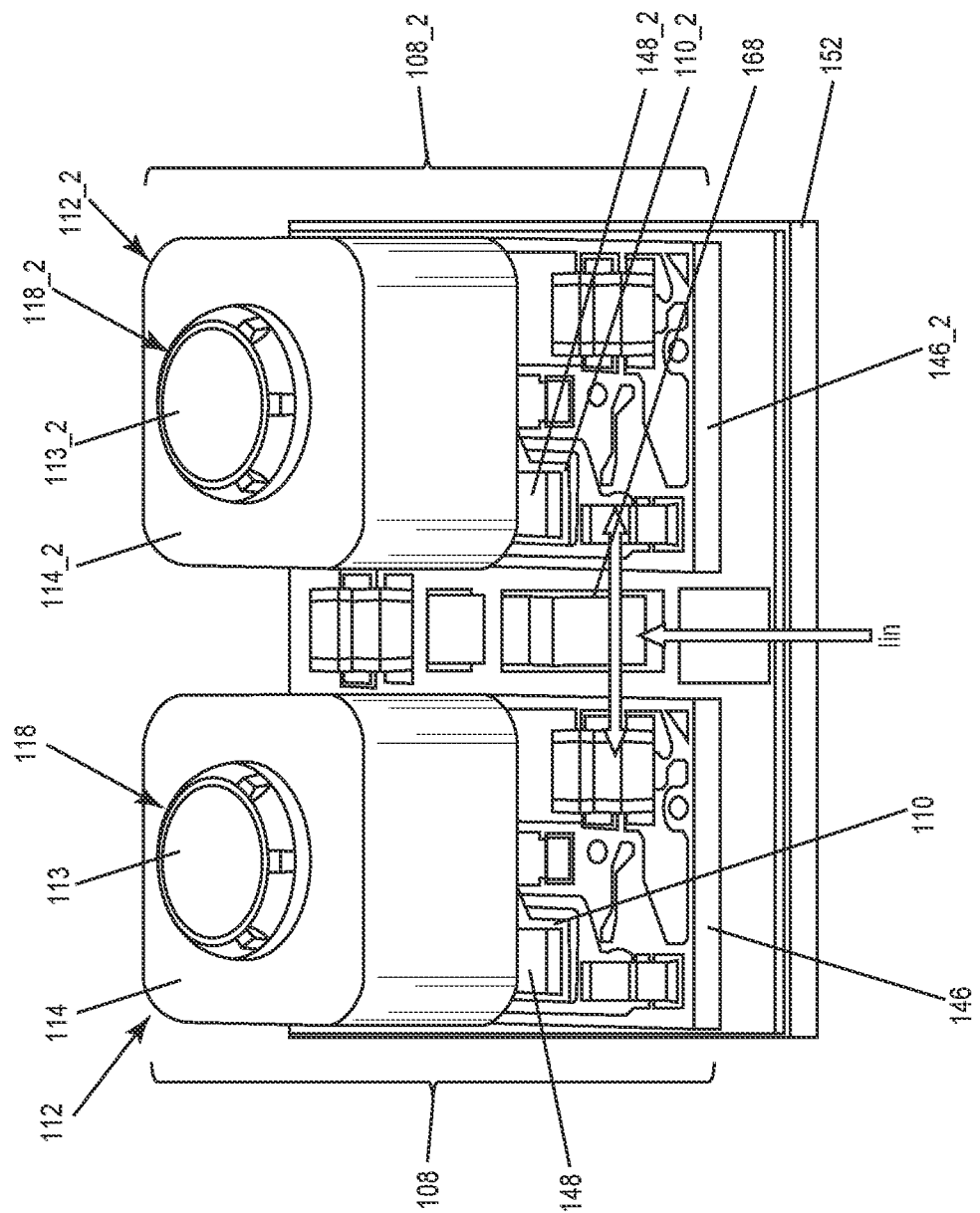
FIG. 3 illustrates a side perspective view of the voltage regulator module, rotated 90° with respect to the orientation in FIG. 1 and without the metal clip.
Figure 4:
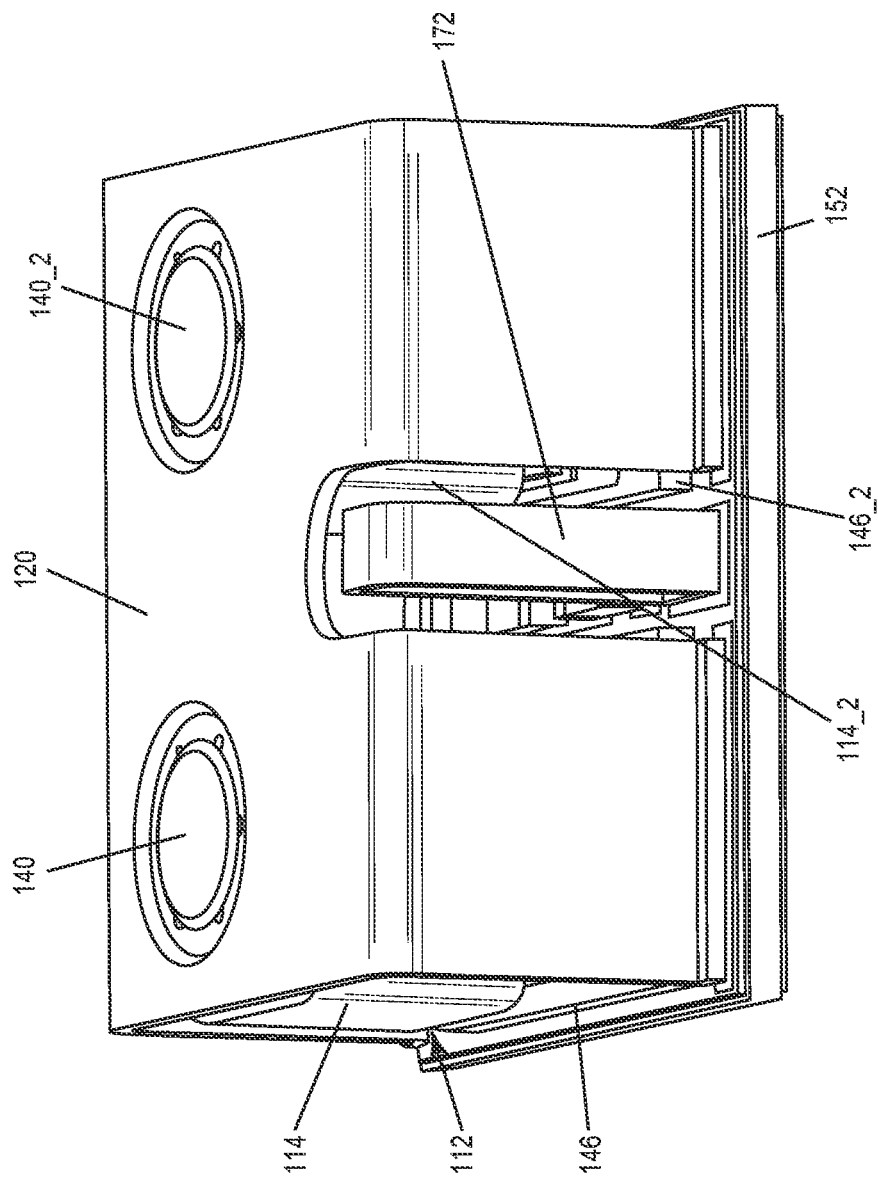
FIG. 4 illustrates the same side perspective view of the voltage regulator module as FIG. 3, but with the metal clip.
Figure 5:
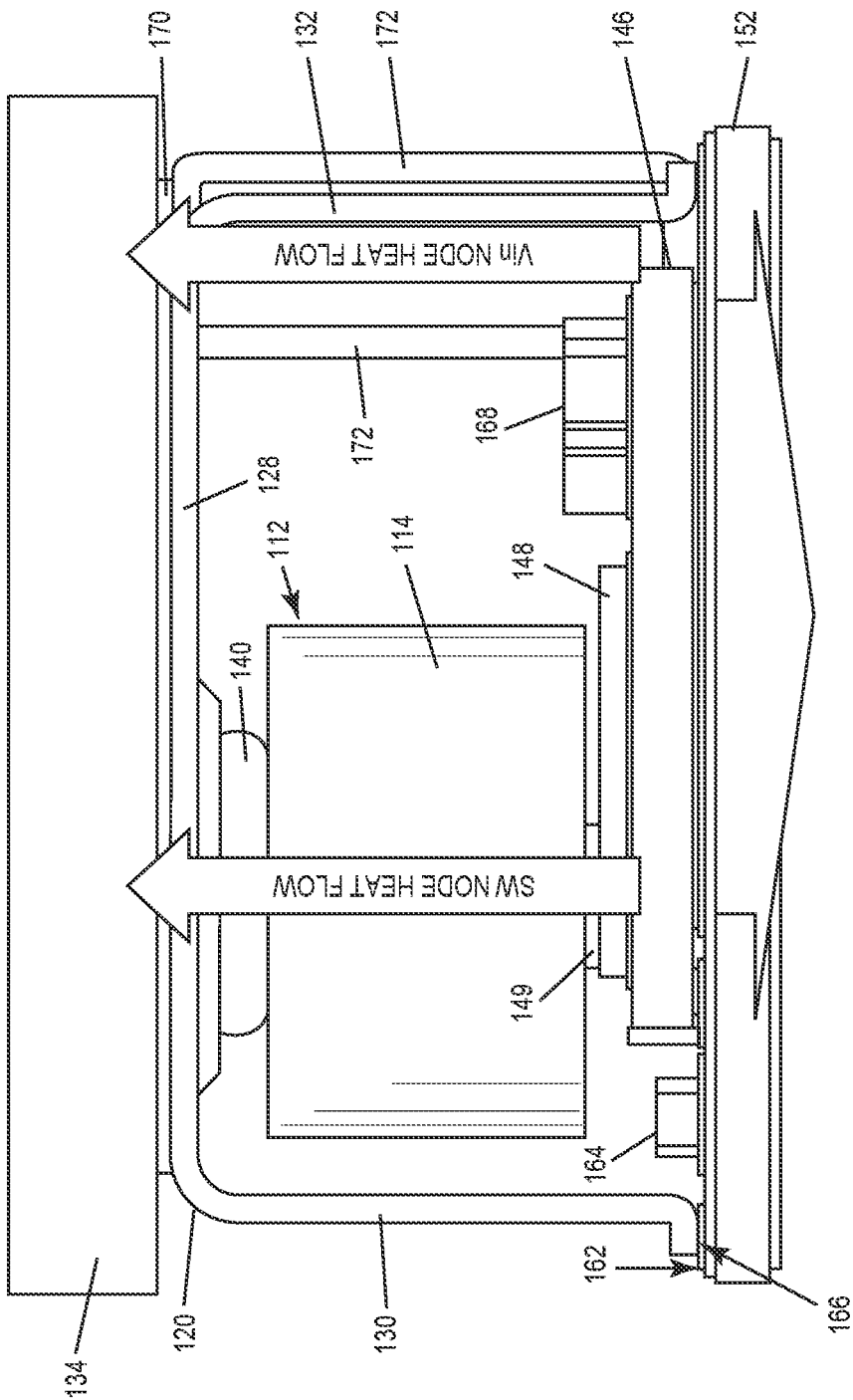
FIG. 5 illustrates the same cross-sectional view of the voltage regulator module as FIG. 2, with a temperature superposition.
Figure 6:
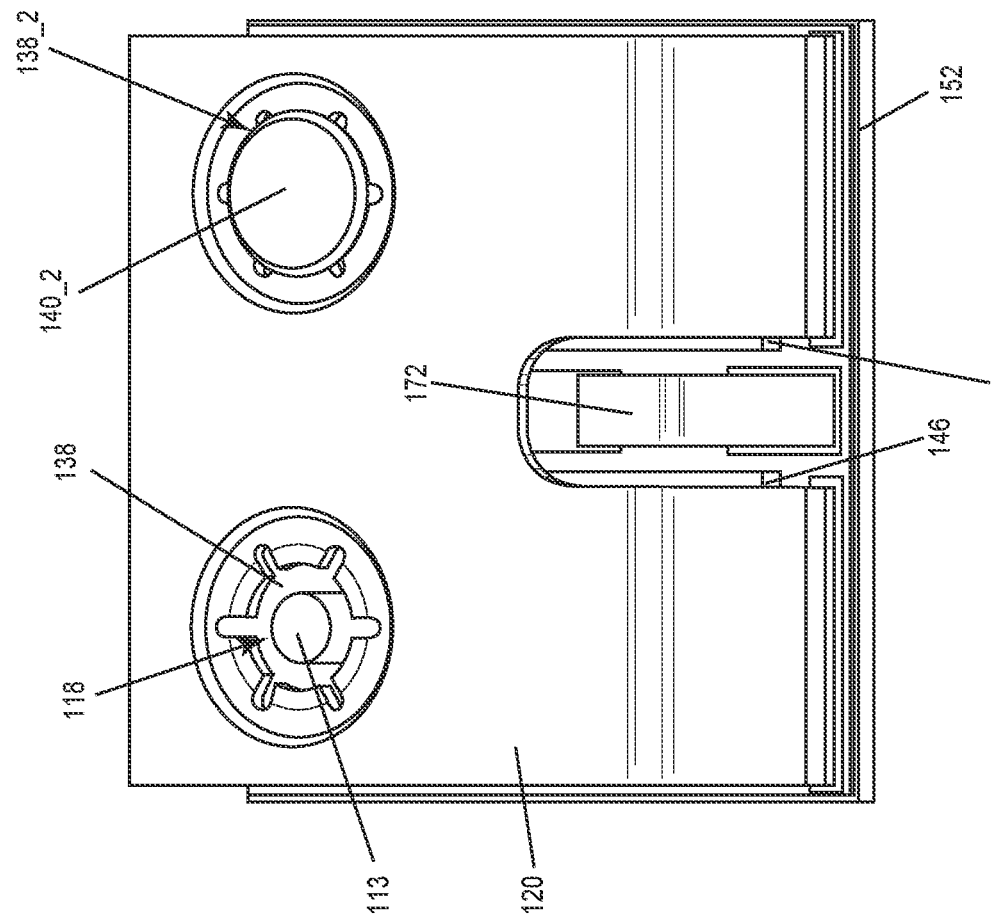
FIG. 6 illustrates a top plan view of the voltage regulator module.

FIG. 1 illustrates a side perspective view of an embodiment of a voltage regulator module 100. FIG. 2 illustrates a cross-sectional view of the voltage regulator module 100 along the line labelled A-A' in FIG. 1, with a current flow superposition. FIG. 3 illustrates a side perspective view of the voltage regulator module 100, rotated 90° with respect to the orientation in FIG. 1 and without the metal clip. FIG. 4 illustrates the same side perspective view of the voltage regulator module 100 as FIG. 3, but with the metal clip. FIG. 5 illustrates the same cross-sectional view of the voltage regulator module 100 as FIG. 2, with a temperature superposition. FIG. 6 illustrates a top plan view of the voltage regulator module 100.

The voltage regulator module 100 includes a power input terminal 102 and a power output terminal 104 at the same side 106 of the voltage regulator module 100 as the power input terminal 102. Accordingly, power is delivered to and from the voltage regulator module 100 at the same side 106 of the voltage regulator module 100.

The voltage regulator module 100 also includes at least one power stage 108. The power stage 108 receives an input voltage 'Vin' from the power input terminal 102 and outputs a phase current 'Iph' at a switch node 'SW' 110 of the power stage 108.

The first power stage 108 includes an inductor 112 having a vertical conductor 113 such as a Cu (copper) rod embedded in a magnetic core 114. The vertical conductor 113 has a first end 116 which is electrically connected to the switch node 110 and a second end 118 opposite the first end 116.

A metal clip 120 electrically connects the second end 118 of the vertical conductor 113 of the inductor 112 to the power output terminal 104 such that power is delivered to and from the voltage regulator module 100 at the same side 106 of the module 100. The metal clip 120 may comprise Cu or any other metal or metal alloy.

The metal clip 120 may have a U-shape and cover the top side 122 of the magnetic core 114 that faces away from the switch node 110, a first side face 124 of the magnetic core 114, and a second side face 126 of the magnetic core 114 opposite the first side face 124.

The metal clip 120 may have a first part 128 connected to the second end 118 of the vertical conductor 113 of the inductor 112 and covering the top side 122 of the magnetic core 114, and a second part 130 electrically connecting the first part 128 of the metal clip 120 to the power output terminal 104 and covering the first side face 124 of the magnetic core 114. The metal clip 120 also may have a third part 132 extending from an opposite end of the first part 128 as the second part 130 and covering the second side face 126 of the magnetic core 114 opposite the first side face 124. The first, second, and third parts 128, 130, 132 of the metal clip 120 may be formed as a single contiguous unit, e.g., by stamping, bending, etc.

The first part 128 of the metal clip 120 connected to the second end 118 of the vertical conductor 113 of the inductor 112 may be planar. A heat sink 134 may be in thermal contact with the planar side 136 of the first part 128 of the metal clip 120 and which faces away from the top side 122 of the magnetic core 114. The heat sink 134 may be air cooled or liquid cooled. The heat sink 134 is not shown in the perspective or plan views, to provide an unobstructed view of the metal clip 120.

The vertical conductor 113 of the inductor 112 may have a cylindrical or cuboidal shape with a longitudinal axis 'L_axis' that extends between the switch node 110 and the metal clip 120. The metal clip 120 may have an opening 138 sized and shaped to receive the second end 118 of the vertical conductor 113. The second end 118 of the vertical conductor 113 may be secured in the opening 138 in the metal clip 120 by a fixing material 140 such as solder, an electrically conductive adhesive, a clip, etc. The righthand side of FIG. 6 shows an opening 138_2 in the metal clip 120 filled with the fixing material 140_2. The lefthand side of FIG. 6 shows another opening 138 in the metal clip 120 before being filled with the fixing material 140, to show the second end 118 of the vertical conductor 113 being received by the opening 138 in the metal clip 120.

The inductor 112 provides cooling and a low-ohmic current path with minimum parasitic inductance. The main current flow Iph from the switch node 110 of the power stage 108 to the power output terminal 104 of the voltage regulator module 100 is through the inductor 112 and the metal clip 120. The main current flow Iph includes an upward vertical component Iph1, a lateral component Iph2, and a downward vertical component Iph3. The upward vertical component Iph1 is through the vertical conductor 113 of the inductor 112 along the longitudinal inductor axis L_axis which is at an angle of approximately 90° (degrees) relative to the side 106 of the voltage regulator module 100 with the power input terminal 102 and the power output terminal 104. The lateral component Iph2 is through the first part 128 of the metal clip 120. The downward vertical component Iph3 is through the second part 130 of the metal clip 120.

The switch node 110 of the voltage regulator module 100 may be interposed between the inductor 112 and at least one power switch 142, 144 of the power stage 108. The power switch or switches 142, 144 may be interposed between the switch node 110 and the side 106 of the voltage regulator module 100 at which the power input terminal 102 and the power output terminal 104 are disposed. The metal clip 120 may cover the power stage 108 and form an electromagnetic shield for the inductor 112 and the power switches 142, 144 of the power stage 108. For example, the metal clip 120 may be configured as a Faraday cage for potentially disturbing electro-magnetic emissions, e.g., from switching of the power switches 142, 144 include din the power stage 108.

The power switches 142, 144 of the power stage 108 may be attached to or embedded in a substrate 146 and electrically connected in series at the switch node 110. Additional elements such as a driver, controller, voltage and/or current sense elements, etc. may be attached to or embedded in the substrate 146. On one configuration, the power switches 142, 144 are connected in a half-bridge configuration at the switch node 110 where the first power switch is a high-side switch that acts as a control switch and the second switch 144 is a low-side switch that acts as a synchronous rectification switch. The circuit may form a synchronous buck converter receiving an input voltage and being coupled to the inductor 112 at the switch node 110 of the power stage 108.

A metal conductor 148 of the substrate 146 may connect the switch node 110 to the first end 116 of the vertical conductor 113 of the inductor 112. The first end 116 of the vertical conductor 113 may be attached to the metal conductor 148 by a joining material 147 such as solder or an electrically conductive adhesive, for example. The substrate 146 may be a multi-layer PCB (printed circuit board), for example. The multi-layer PCB may include patterned metallization layers 149 and interconnecting vias 150. The multi-layer PCB may be attached to another substrate 152 which also may have one or more patterned metallization layers 154 and interconnecting vias 156. The additional substrate 152 may be a system board such as a motherboard or an accelerator card of an electronic assembly with multiple processors, or an interposer such as a molded interconnect substrate that attaches to such a system board. The power stage 108 provides current to one or more of the system processors (not shown in FIGS. 1A and 1B).

The power input and power output terminals 102, 104 of the of the voltage regulator module 100 may be disposed at the bottom side 106 of the additional substrate 152. The bottom side 106 of the additional substrate 152 may include additional terminals such a ground 'GND' terminal 158, I/O (input/output) terminals 160, etc. The metal clip 120 may be attached to the top side 162 of the additional substrate 152 at one or both ends of the metal clip 120. One or more output capacitors 164 may be attached to the top side 162 of the additional substrate 152 in proximity to a contact point 166 between the metal clip 120 and the additional substrate 152. One or more input capacitors 168 may be attached to the substrate 146 with the power switches 142, 144. The current flow paths through the additional substrate 152 may be mostly vertical, as indicated in FIGS. 1 and 2. This, in combination with the vertical inductor 112 and metal clip 120, yields low-ohmic current paths with minimum parasitic inductance.

The switch node SW, input node Vin, and substrate heat flow paths are shown in FIG. 5. In some cases, the heat sink 134 may be electrically isolated from the metal clip 120 by a thermal interface material 170 that is electrically insulative such as a silicone-based or synthetic-based thermal compound or grease. The power switches 142, 144 are cooled through the metal clip 120 coupling the switch node 110 to the inductor 112 and through the inductor 112 towards the heat sink 134 attached to opposite side of the voltage regulator module 100 as the side with the power input and output terminals 102, 104. A second thermal heat flow path is provided downward towards the additional substrate 152. The input node Vin is cooled through a second metal clip 172 towards the heat sink 134.

The second metal clip 172 is electrically connected to the power input terminal 102. The second metal clip 172 extends away from the power input terminal 102 like the second part 130 of the first metal clip 120 extends away from the power output terminal 104, but at the opposite side of the voltage regulator module 100. To be more specific, the second metal clip 172 may be a u-shaped (copper) clip which is electrically isolated from the metal clip 120, and which extends in a first plane between the power input terminal 102 and a plane of the first part 128 of the metal clip 120, in a second plane which is substantially coplanar with respect to the plane of the first part 128 of the metal clip 120, and in a third plane between the plane of the first part 128 of the metal clip 120 and the input capacitor 168. The input capacitor 168 may be attached to or embedded in the substrate 146. The first and the third planes may be substantially parallel with regard to each other and with regard to a plane of the second part 130 of the metal clip 120. Thus, the second metal clip 172 may conduct electrical current from the power input terminal 102 via the second plane to the input capacitor 168. At this, thermal heat may be guided to a heat sink attached to the second plane, thereby effectively cooling the power input terminal 102. The second metal clip 172 instead may be electrically connected to the ground terminal 158 of the voltage regulator module 100 and extend away from the ground terminal 158. In either (Vin or GND) configuration, the second metal clip 172 instead of the first metal clip 120 may cover the power stage 108 and form an electromagnetic shield for the inductor 112 and power switches 142, 144 of the power stage 108. For example, the second metal clip 172 may be configured as a Faraday cage for potentially disturbing electro-magnetic emissions, e.g., from switching of the power switches 142, 144 include din the power stage 108.

As shown in FIG. 3, the voltage regulator module 100 may also include a second power stage 108_2 which is similar or identical to the first power stage 108. Any component of the second power stage 108_2 that is similar or identical to a corresponding component of the first power stage 108 is labelled '_2' to indicate the similar or identical nature. In the illustrated example, the voltage regulator module 100 has two synchronous buck converter circuits and two single phase inductors 112, 112_2 which are not electrically coupled to each other. Both power stages 108, 108_2 receive the same input voltage Vin. The metal clip 120 coalesces the output currents of both phases and feeds the summed current back to the module interface with the power input and output terminals 102, 104.

More particularly, the second power stage 108_2 receives the input voltage Vin from the power input terminal 102 and outputs a phase current at a switch node 110_2 of the second power stage 108_2. The second power stage 108_2 includes an inductor 112_2 having a vertical conductor 113_2 embedded in the same or different magnetic core 114_2 as the vertical conductor 113 of the inductor 112 of the first power stage 108. The vertical conductor 113_2 of the inductor 112_2 of the second power stage 1082 has a first end (out of view) which is electrically connected to the switch node 110_2 of the second power stage 108_2 and a second end 118_2 opposite the first end. The metal clip 120 electrically connects the second end 118_2 of the second vertical conductor 113_2 to the power output terminal 104 such that the phase currents output by the first and second power stages 108, 1082 of the voltage regulator module 100 are combined by the metal clip 120. The input current path 'Iin' is indicated in FIG. 3.

In FIG. 3, the magnetic cores 114, 114_2 are illustrated for single phase use. However, the magnetic element instead may comprise coupled inductors being attached to two separate half-bridge circuits. In this case, at least two vertical conductors penetrate through a common magnetic core. These two vertical conductors may be electrically coupled to two independent half-bridge circuits which may operate at 180° phase shift to each other to take full benefit of coupled inductors. The output current is coalesced and routed back to the interface with the power input and output terminals 102, 104 by the metal clip 120, which surrounds each power stage 108, 108_2 and provides electromagnetic shielding. In some cases, the current path of the metal clip 120 may be located outside the magnetic core material and therefore produces no magnetic flux. This part of the metal clip 120 instead may be embedded in the magnetic core material 114 of the inductor 112.

Figure 7:
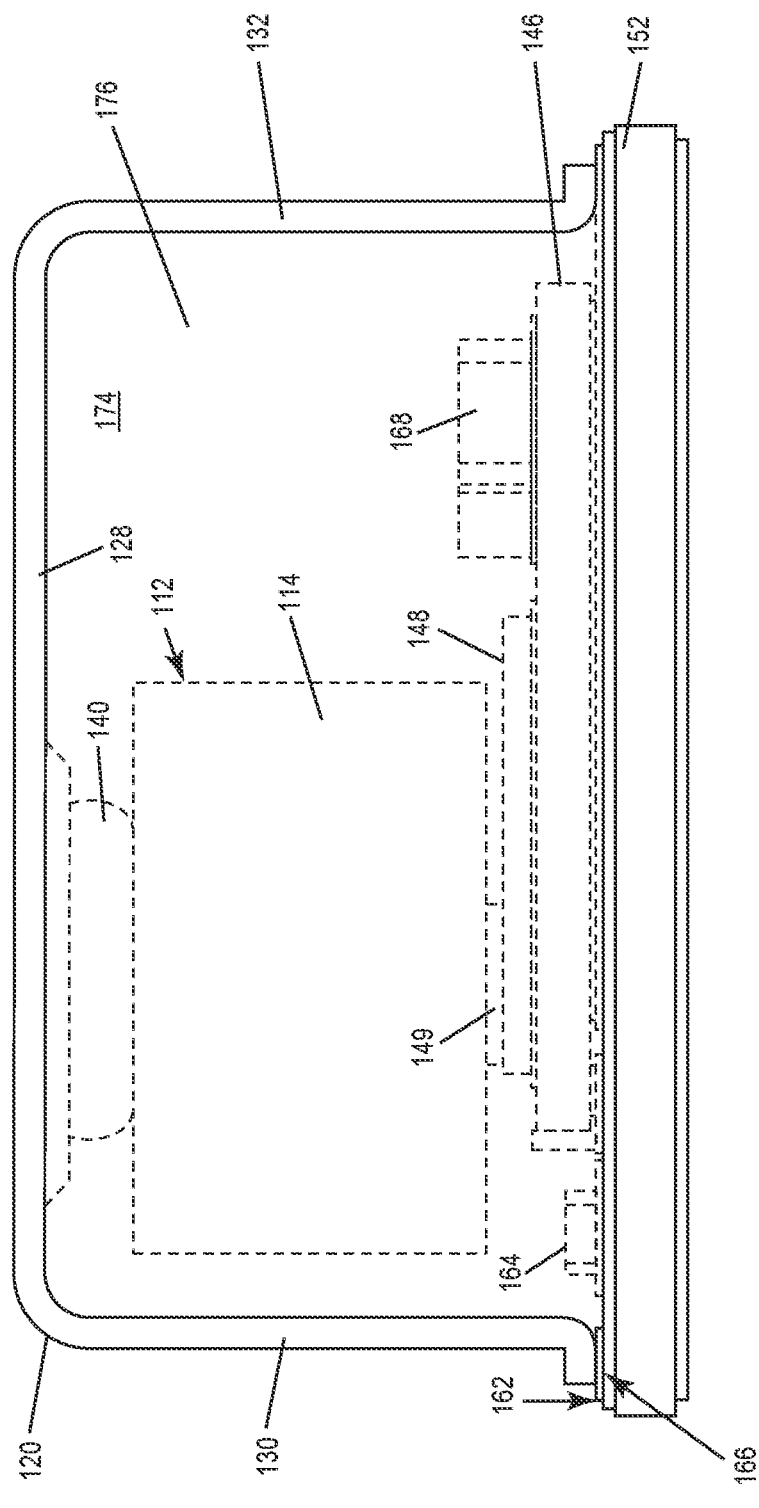
FIG. 7 illustrates a cross-sectional view of the voltage regulator module, according to another embodiment.

FIG. 7 illustrates a cross-sectional view of the voltage regulator module 100, according to another embodiment. The metal clip 120 and the additional substrate 152 may form an enclosure that encloses each power stage 108, 1082 of the voltage regulator module 100 on at least four sides. For example, in FIG. 7, the metal clip 120 and the additional substrate 152 collectively enclose each power stage 108, 1082 on the top and bottom sides and on two opposing lateral sides. The open space 174 within the enclosure may be filled with a thermal interface material 176 such as a silicone-based or synthetic-based thermal compound or grease, a potting compound, gel, etc.

Figure 8:
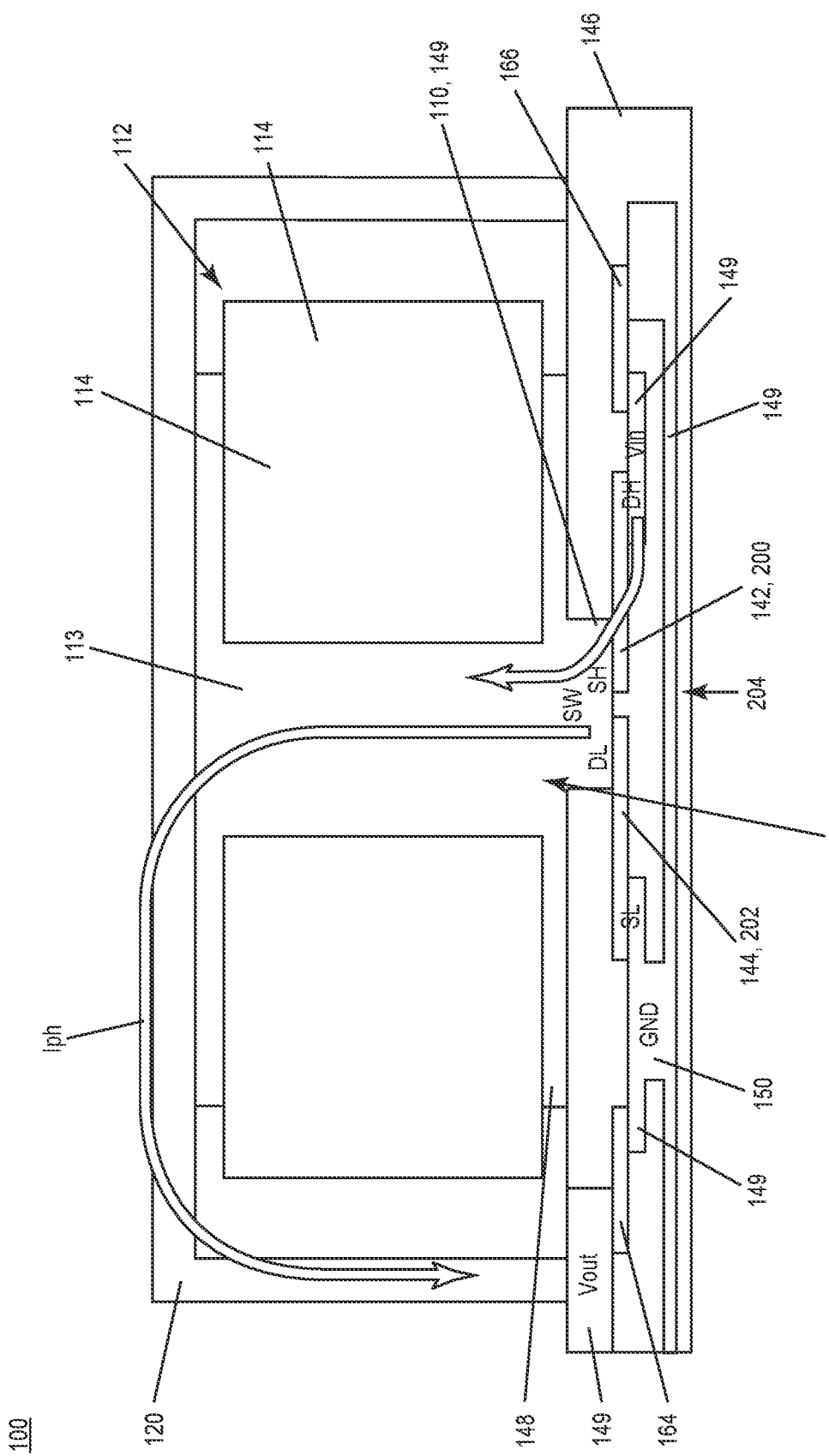
FIG. 8 illustrates a cross-sectional view of the voltage regulator module, according to another embodiment.

FIG. 8 illustrates a cross-sectional view of the voltage regulator module 100, according to another embodiment. The power switches 142, 144 of the power stage 108 may include a high-side Si or SiC power MOSFET die 200 having a drain terminal 'DH' electrically connected to the power input terminal 102 of the voltage regulator module 100 and a source terminal 'SH' electrically connected to the switch node 110, and a low-side Si or SiC power MOSFET die 202 having a drain terminal 'DL' electrically connected to the switch node 110 and a source terminal 'SL' electrically connected to the ground terminal 158 of the voltage regulator module 100. The metal conductor 148 of the substrate 146 electrically connects the source terminal SH of the high-side power MOSFET die 200 and the drain terminal DL of the low-side power MOSFET die 202 to the first end 116 of the vertical conductor 113 of the inductor 102 in a half-bridge configuration. The gate terminals of the high-side and low-side power MOSFET dies 200, 202 are out of view in FIG. 8. The metal clip 120 is at the output potential Vout and the output potential Vout corresponds to the output voltage of the voltage regulator module 100.

The power switches 142, 144 are illustrated as vertical power MOSFET devices where the source terminals SH, SL and drain terminals DH, DL of each die 200, 202 are disposed at opposite sides of the dies 200, 202. The drain terminal DH of the high-side power MOSFET 200 and the source terminal SL of the low-side power MOSFET die 202 face away from the inductor 112 whereas the source terminal SH of the high-side power MOSFET die 200 and the drain terminal DL of the low-side power MOSFET die face towards the inductor 112 to minimize current redistribution and avoid parasitic inductance. Vertical devices 200, 202 with a common switching node 110 may be mounted using chip embedding technology, PQFN (power quad flat no-lead) packages with exposed terminals, etc. Chip embedding provides the lowest thickness, low weight, and good thermal interfaces. The power switches 142, 144 instead may be mounted to a mother board below the power input/output interface of the voltage regulator module 100. However, these are just examples.

In the case of lateral power devices such as GaN HEMTs (high-electron mobility transistors), the source terminals SH, SL and drain terminals DH, DL of each die 200, 202 are disposed at the same side of the dies 200, 202. Other types of power transistor dies such as IGBTs (insulated-gate bipolar transistors) may be used instead. In each case, the patterned metallization layers 149 and interconnecting vias 150 of the substrate 146 with the power switches 142, 144 may be designed to accommodate electrical connections to either vertical or lateral power semiconductor dies 200, 202.

The input (Vin), output (Vout), and ground (GND) potentials within the substrate 146 are labelled in FIG. 8 but the additional substrate 152 is not shown. Accordingly, the power input terminal 102, the power output terminal 104, and the ground terminal 158 of the voltage regulator module 100 are not shown in FIG. 8.

The additional substrate 152 instead may be omitted from the voltage regulator module 100 since the metal clip 120 may be attached to the substrate 146 with the power switches 142, 144, e.g., as shown in FIG. 8. In this case, the power input terminal 102, the power output terminal 104, and the ground terminal 158 of the voltage regulator module 100 may be disposed at the bottom side 204 of the substrate 146 with the power switches 142, 144. The exposed Vin, Vout, and GND terminal end points are out of view in FIG. 8 due to the position of the cross-section. Also as shown in FIG. 8, the input and output capacitors 168, 164 for the power stage 108 may be embedded in the substrate 146 with the power switches 142, 144. The input capacitor(s) 166 of the voltage regulator module 100 may be in proximity to the drain terminal DH of the high-side power MOSFET die 200. The output capacitor(s) 164 of the voltage regulator module 100 may be in proximity to the source terminal SL of the low-side power MOSFET die 202.

Figure 9:
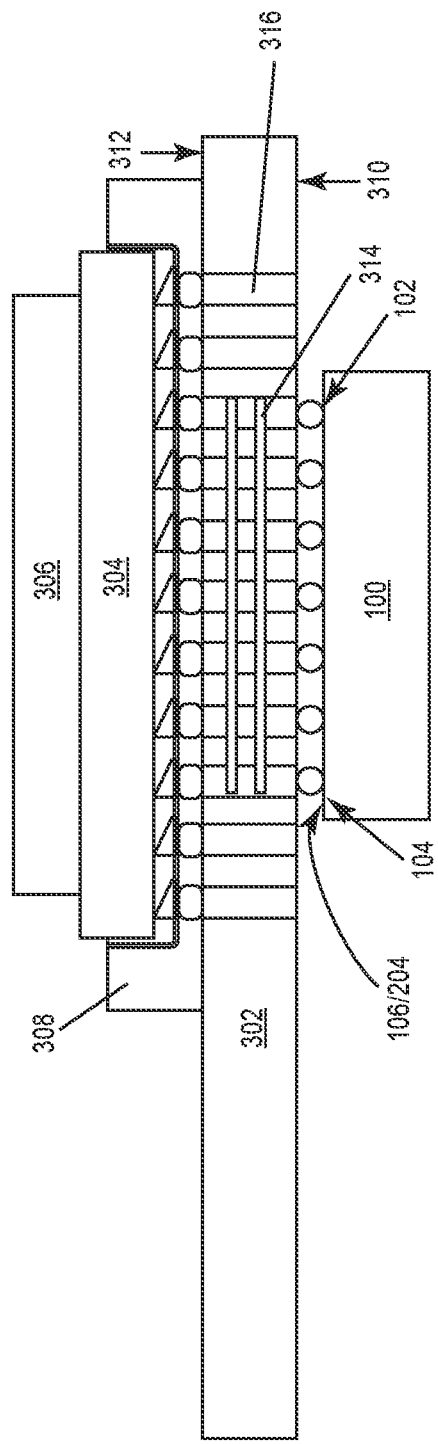
FIG. 9 illustrates a cross-sectional view of an embodiment of an electronic assembly that includes at least one of the voltage regulator modules.

FIG. 9 illustrates an embodiment of an electronic assembly 300 that includes at least one of the voltage regulator modules 100. The electronic assembly 300 also includes a circuit board 302 such as a PCB motherboard, a plurality of processor substrates 304 mounted to the circuit board 302, and a processor (chip) die 306 mounted to each processor substrate 304. Each processor substrate 304 may be mounted by direct attachment to the circuit board 302 or through an interposer 308 such as a socket. The circuit board 302 may be the additional substrate 152 shown in FIGS. 1 through 7, or may be a separate system board in case the additional substrate 152 is an interposer.

Each voltage regulator module 100 is mounted to the circuit board 302 and provides power to one or more of the processors 306. As previously described herein, each voltage regulator module 100 includes a power input terminal 102 attached to a first side 310 of the circuit board 302 and a power output terminal 104 attached to the same first side 310 of the circuit board 302 as the power input terminal 102. At least one power stage 108 of each voltage regulator module 100 receives an input voltage from the power input terminal 102 and outputs a phase current at a switch node 110 of the power stage 108. Each voltage regulator power stage 108 includes an inductor 112 having a vertical conductor 113 embedded in a magnetic core 114. The vertical conductor 113 of the inductor 112 has a first end 116 electrically connected to the switch node 110 and a second end 118 opposite the first end. A metal clip 120 connects the second end 118 of the vertical conductor 113 of the inductor 112 to the power output terminal 104 such that power is delivered to and from the corresponding voltage regulator module 100 at the same first side 310 of the circuit board 302.

The power switches 142, 144 of each voltage regulator power stage 108 are embedded in or mounted to a separate substrate 146/152 such that the power input terminal 102 and the power output terminal 104 of the corresponding voltage regulator module 100 are disposed at the same side 106/204 of the separate substrate 146/152 which faces the circuit board 302. The voltage regulator modules 100 and the processor substrates 304 may be mounted on opposite sides 310, 312 of the circuit board 302. Each voltage regulator module 100 and one or more of the processor substrates 304 may at least partly vertically overlap one another. The voltage regulator modules 100 and the processor substrates 304 instead may be mounted on the same side 310/312 of the circuit board 302, e.g., laterally positioned besides one another on an acceleration card such as open accelerator module card.

In both mounting configurations, input power, output power, and ground are delivered at the same side 106/204 of each voltage regulator module 100. The input current flows vertically through the first power switch 142 to a metal conductor 148, laterally from the metal conductor 148 to the vertical conductor 113 of the inductor 112, which penetrates vertically through the magnetic core 114, and the current returns outside the magnetic core 114 back to the same side 106/204 of the voltage regulator module 100 via the metal clip 120, e.g., as shown in FIGS. 2 and 8. During freewheeling (synchronous) operation, the current flows from the ground terminal 158 vertically through the second power switch 144 and from the drain terminal DL of this low-side synchronous FET to the vertical conductor 113 of the inductor 112, through the magnetic core 114 and back to the same side 106/204 of the voltage regulator module 100 via the metal clip 120.

The commutation loop of such a buck converter is the area spanned by the power input terminal 102 and corresponding internal substrate connections, the high-side power switch 142, the low-side power switch 144, and the ground terminal 158 and corresponding internal substrate connections. Placing the input capacitor(s) 168 in closest proximity to this commutation loop results in high efficiency and low parasitics. For example, the input capacitor(s) 168 may be placed on top of the half-bridge circuit embedded in the power stage substrate 146. The input capacitor(s) instead may be placed at the bottom side of the circuit board 302 below the side 106/204 of the voltage regulator module 100 with the power input and output terminals 102, 104, or embedded in the power stage substrate 146, e.g., as shown in FIG. 8.

The circuit board 302 may include patterned metallization layers 314 and interconnecting vias 316 for routing signal, power, and ground connections between the voltage regulator modules 100 and the processor substrates 304. Details of the voltage regulator module 100 are shown in FIGS. 1 through 8.

Although the present disclosure is not so limited, the following numbered examples demonstrate one or more aspects of the disclosure.

Example 1. A voltage regulator module, comprising: a power input terminal; a power output terminal at a same side of the voltage regulator module as the power input terminal; a first power stage configured to receive an input voltage from the power input terminal and output a phase current at a switch node of the first power stage, the first power stage including an inductor having a vertical conductor embedded in a magnetic core, the vertical conductor having a first end which is electrically connected to the switch node and a second end opposite the first end; and a first metal clip which electrically connects the second end of the vertical conductor to the power output terminal such that power is delivered to and from the voltage regulator module at the same side of the voltage regulator module.

Example 2. The voltage regulator module of example 1, wherein power switches of the first power stage are attached to or embedded in a substrate and electrically connected in series at the switch node, and wherein a metal conductor of the substrate electrically connects the switch node to the first end of the vertical conductor of the inductor.

Example 3. The voltage regulator module of example 2, wherein the power switches of the first power stage include a first power MOSFET die having a drain terminal electrically connected to the power input terminal of the voltage regulator module and a source terminal electrically connected to the switch node, and a second power MOSFET die having a drain terminal electrically connected to the switch node and a source terminal electrically connected to a ground terminal of the voltage regulator module, and wherein the metal conductor electrically connects the source terminal of the first power MOSFET die and the drain terminal of the second power MOSFET die to the first end of the vertical conductor of the inductor.

Example 4. The voltage regulator module of example 3, wherein the first power MOSFET die and the second power MOSFET die are both vertical devices, wherein both the drain terminal of the first power MOSFET die and the source terminal of the second power MOSFET die face away from the inductor, and wherein both the source terminal of the first power MOSFET die and the drain terminal of the second power MOSFET die face towards the inductor.

Example 5. The voltage regulator module of example 3 or 4, further comprising one or more input capacitors attached to or embedded in the substrate in proximity to the drain terminal of the first power MOSFET die.

Example 6. The voltage regulator module of any of examples 1 through 5, further comprising: a second power stage configured to receive the input voltage from the power input terminal and output a phase current at a switch node of the second power stage, wherein the second power stage includes an inductor having a vertical conductor embedded in the same or different magnetic core as the vertical conductor of the inductor of the first power stage, wherein the vertical conductor of the inductor of the second power stage has a first end which is electrically connected to the switch node of the second power stage and a second end opposite the first end, wherein the first metal clip electrically connects the second end of the vertical conductor of the second inductor to the power output terminal such that the phase currents output by the first and second power stages are combined by the first metal clip.

Example 7. The voltage regulator module of any of examples 1 through 6, wherein the first metal clip covers the first power stage and forms an electromagnetic shield for the inductor and power switches of the first power stage.

Example 8. The voltage regulator module of any of examples 1 through 7, further comprising: a second metal clip electrically connected to the power input terminal, wherein the second metal clip extends away from the power input terminal.

Example 9. The voltage regulator module of example 8, wherein the second metal clip covers the power stage and forms an electromagnetic shield for the inductor and power switches of the power stage.

Example 10. The voltage regulator module of any of examples 1 through 7, further comprising: a second metal clip electrically connected to a ground terminal of the voltage regulator module, wherein the second metal clip extends away from the ground terminal.

Example 11. The voltage regulator module of example 10, wherein the second metal clip covers the power stage and forms an electromagnetic shield for the inductor and power switches of the power stage.

Example 12. The voltage regulator module of any of examples 1 through 11, further comprising: a heat sink in thermal contact with the first metal clip at a side of the first metal clip that faces away from the first power stage.

Example 13. The voltage regulator module of any of examples 1 through 12, wherein the first metal clip comprises: a first part connected to the second end of the vertical conductor of the inductor and covering a first side of the magnetic core that faces away from the switch node; and a second part electrically connecting the first part to the power output terminal and covering a first side face of the magnetic core, and wherein the second part of the first metal clip is connected to the power output terminal.

Example 14. The voltage regulator module of example 13, wherein the first metal clip comprises: a third part extending from an opposite end of the first part as the second part and covering a second side face of the magnetic core opposite the first side face.

Example 15. The voltage regulator module of any of examples 1 through 14, wherein the first metal clip has a U-shape and covers a first side of the magnetic core that faces away from the switch node, a first side face of the magnetic core, and a second side face of the magnetic core opposite the first side face.

Example 16. The voltage regulator module of any of examples 1 through 15, wherein the first metal clip comprises a planar part connected to the second end of the vertical conductor of the inductor and covering a first side of the magnetic core that faces away from the switch node, the voltage regulator module further comprising: a heat sink in thermal contact with a side of the planar part of the first metal clip that faces away from the first side of the magnetic core.

Example 17. The voltage regulator module of any of examples 1 through 16, wherein the vertical conductor of the inductor has a cylindrical or cuboidal shape with a longitudinal axis that extends between the switch node and the first metal clip.

Example 18. The voltage regulator module of any of examples 1 through 17, wherein the switch node is interposed between the inductor and at least one power switch of the first power stage, and the at least one power switch is interposed between the switch node and the side of the voltage regulator module at which the power input terminal and the power output terminal are disposed.

Example 19. The voltage regulator module of any of examples 1 through 18, wherein the first metal clip has an opening sized and shaped to receive the second end of the vertical conductor of the inductor.

Example 20. The voltage regulator module of example 19, wherein the second end of the vertical conductor of the inductor is secured in the opening in the first metal clip by solder or an electrically conductive adhesive.

Example 21. An electronic assembly, comprising: a circuit board; a processor substrate mounted to the circuit board; a processor mounted to the processor substrate; and a voltage regulator module mounted to the circuit board and configured to provide power to the processor, wherein the voltage regulator module comprises: a power input terminal attached to a first side of the circuit board; a power output terminal attached to the same first side of the circuit board as the power input terminal; a first power stage configured to receive an input voltage from the power input terminal and output a phase current at a switch node of the first power stage, the first power stage including an inductor has a vertical conductor embedded in a magnetic core, the vertical conductor having a first end which is electrically connected to the switch node, and a second end opposite the first end; and a first metal clip which connects the second end of the vertical conductor to the power output terminal such that power is delivered to and from the voltage regulator module at the same first side of the circuit board.

Example 22. The electronic assembly of example 21, wherein power switches of the first power stage are embedded in or mounted to a separate substrate, wherein the power input terminal and the power output terminal of the voltage regulator module are disposed at a same side of the separate substrate which faces the circuit board.

Example 23. The electronic assembly of example 21 or 22, wherein the voltage regulator module and the processor substrate are mounted on opposite sides of the circuit board, and wherein the voltage regulator module and the processor substrate at least partly vertically overlap one another.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage regulator module, comprising:
   a power input terminal;
   a power output terminal at a same side of the voltage regulator module as the power input terminal;
   a first power stage configured to receive an input voltage from the power input terminal and output a phase current at a switch node of the first power stage, the first power stage including an inductor having a vertical conductor embedded in a magnetic core, the vertical conductor having a first end which is electrically connected to the switch node and a second end opposite the first end; and
   a first metal clip which electrically connects the second end of the vertical conductor to the power output terminal such that power is delivered to and from the voltage regulator module at the same side of the voltage regulator module.

2. The voltage regulator module of claim 1, wherein power switches of the first power stage are attached to or embedded in a substrate and electrically connected in series at the switch node, and wherein a metal conductor of the substrate electrically connects the switch node to the first end of the vertical conductor of the inductor.

3. The voltage regulator module of claim 2, wherein the power switches of the first power stage include a first power MOSFET die having a drain terminal electrically connected to the power input terminal of the voltage regulator module and a source terminal electrically connected to the switch node, and a second power MOSFET die having a drain terminal electrically connected to the switch node and a source terminal electrically connected to a ground terminal of the voltage regulator module, and wherein the metal conductor electrically connects the source terminal of the first power MOSFET die and the drain terminal of the second power MOSFET die to the first end of the vertical conductor of the inductor.

4. The voltage regulator module of claim 3, wherein the first power MOSFET die and the second power MOSFET die are both vertical devices, wherein both the drain terminal of the first power MOSFET die and the source terminal of the second power MOSFET die face away from the inductor, and wherein both the source terminal of the first power MOSFET die and the drain terminal of the second power MOSFET die face towards the inductor.

5. The voltage regulator module of claim 3, further comprising one or more input capacitors attached to or embedded in the substrate in proximity to the drain terminal of the first power MOSFET die.

6. The voltage regulator module of claim 1, further comprising:
   a second power stage configured to receive the input voltage from the power input terminal and output a phase current at a switch node of the second power stage,
   wherein the second power stage includes an inductor having a vertical conductor embedded in the same or different magnetic core as the vertical conductor of the inductor of the first power stage,
   wherein the vertical conductor of the inductor of the second power stage has a first end which is electrically connected to the switch node of the second power stage and a second end opposite the first end, wherein the first metal clip electrically connects the second end of the vertical conductor of the second inductor to the power output terminal such that the phase currents output by the first and second power stages are combined by the first metal clip.

7. The voltage regulator module of claim 1, wherein the first metal clip covers the first power stage and forms an electromagnetic shield for the inductor and power switches of the first power stage.

8. The voltage regulator module of claim 1, further comprising:

a second metal clip electrically connected to the power input terminal, wherein the second metal clip extends away from the power input terminal.

9. The voltage regulator module of claim 8, wherein the second metal clip covers the power stage and forms an electromagnetic shield for the inductor and power switches of the power stage.

10. The voltage regulator module of claim 1, further comprising:

a second metal clip electrically connected to a ground terminal of the voltage regulator module, wherein the second metal clip extends away from the ground terminal.

11. The voltage regulator module of claim 10, wherein the second metal clip covers the power stage and forms an electromagnetic shield for the inductor and power switches of the power stage.

12. The voltage regulator module of claim 1, further comprising:

a heat sink in thermal contact with the first metal clip at a side of the first metal clip that faces away from the first power stage.

13. The voltage regulator module of claim 1, wherein the first metal clip comprises:

a first part connected to the second end of the vertical conductor of the inductor and covering a first side of the magnetic core that faces away from the switch node; and a second part electrically connecting the first part to the power output terminal and covering a first side face of the magnetic core, wherein the second part of the first metal clip is connected to the power output terminal.

14. The voltage regulator module of claim 13, wherein the first metal clip comprises:

a third part extending from an opposite end of the first part as the second part and covering a second side face of the magnetic core opposite the first side face.

15. The voltage regulator module of claim 1, wherein the first metal clip has a U-shape and covers a first side of the magnetic core that faces away from the switch node, a first side face of the magnetic core, and a second side face of the magnetic core opposite the first side face.

16. The voltage regulator module of claim 1, wherein the first metal clip comprises a planar part connected to the second end of the vertical conductor of the inductor and covering a first side of the magnetic core that faces away from the switch node, the voltage regulator module further comprising:

a heat sink in thermal contact with a side of the planar part of the first metal clip that faces way from the first side of the magnetic core.

17. The voltage regulator module of claim 1, wherein the vertical conductor of the inductor has a cylindrical or cuboidal shape with a longitudinal axis that extends between the switch node and the first metal clip.

18. The voltage regulator module of claim 1, wherein the switch node is interposed between the inductor and at least one power switch of the first power stage, and the at least one power switch is interposed between the switch node and the side of the voltage regulator module at which the power input terminal and the power output terminal are disposed.

19. The voltage regulator module of claim 1, wherein the first metal clip has an opening sized and shaped to receive the second end of the vertical conductor of the inductor.

20. The voltage regulator module of claim 19, wherein the second end of the vertical conductor of the inductor is secured in the opening in the first metal clip by solder or an electrically conductive adhesive.

21. An electronic assembly, comprising:

a circuit board;

a processor substrate mounted to the circuit board;

a processor mounted to the processor substrate; and a voltage regulator module mounted to the circuit board and configured to provide power to the processor, wherein the voltage regulator module comprises:

a power input terminal attached to a first side of the circuit board;

a power output terminal attached to the same first side of the circuit board as the power input terminal;

a first power stage configured to receive an input voltage from the power input terminal and output a phase current at a switch node of the first power stage, the first power stage including an inductor having a vertical conductor embedded in a magnetic core, the vertical conductor having a first end which is electrically connected to the switch node, and a second end opposite the first end; and a first metal clip which connects the second end of the vertical conductor to the power output terminal such that power is delivered to and from the voltage regulator module at the same first side of the circuit board.

22. The electronic assembly of claim 21, wherein power switches of the first power stage are embedded in or mounted to a separate substrate, wherein the power input terminal and the power output terminal of the voltage regulator module are disposed at a same side of the separate substrate which faces the circuit board.

23. The electronic assembly of claim 21, wherein the voltage regulator module and the processor substrate are mounted on opposite sides of the circuit board, and wherein the voltage regulator module and the processor substrate at least partly vertically overlap one another.

* * * * *

UNITED STATES PATENT AND TRADEMARK OFFICE
CERTIFICATE OF CORRECTION

PATENT NO. : 12,150,236 B2
APPLICATION NO. : 17/742442
DATED : November 19, 2024
INVENTOR(S) : G. Deboy et al.

Page 1 of 1

It is certified that error appears in the above-identified patent and that said Letters Patent is hereby corrected as shown below:

In the Claims

Column 14, Line 5 (Claim 16, Line 8), please change "faces way" to -- faces away --.

Signed and Sealed this
Second Day of September, 2025

Coke Morgan Stewart
*Acting Director of the United States Patent and Trademark Office*